Sept. 21, 1965 G. B. HERZOG 3,207,913

LOGIC CIRCUIT EMPLOYING TRANSISTORS AND NEGATIVE RESISTANCE DIODES

Filed Jan. 13, 1960 3 Sheets-Sheet 1

INVENTOR.
Gerald B. Herzog
BY John V. Regan
ATTORNEY

INVENTOR.
Gerald B. Herzog
BY John V. Regan
ATTORNEY

INVENTOR.
Gerald B. Herzog
BY John V. Regan
ATTORNEY

United States Patent Office 3,207,913

Patented Sept. 21, 1965

3,207,913

LOGIC CIRCUIT EMPLOYING TRANSISTORS AND NEGATIVE RESISTANCE DIODES

Gerald B. Herzog, Princeton, N.J., assignor to Radio Corporation of America, a corporation of Delaware Filed Jan. 13, 1960, Ser. No. 2,250
3 Claims. (Cl. 307—88.5)

The present invention relates to circuits which employ the advantageous characteristics of negative resistance diodes and transistors.

The invention, in its broader aspects, includes a transistor having base, emitter and collector electrodes and a negative resistance diode directly connected to one of the electrodes in such manner that when the diode is in its low voltage state, the transistor output is at one level and when the diode is in its high voltage state, the transistor output is at another, substantially different level.

A new and improved binary added circuit according to the invention includes a first transistor and a negative resistance diode in series with the emitter-to-base diode of the transistor for performing the sum function, and a second transistor and a second negative resistance diode in parallel with the emitter-to-base diode of the second transistor for performing the carry function.

The invention will be described in greater detail by reference to the following description taken in connection with the accompanying drawing in which:

FIG. 1 includes a characteristic curve of current versus voltage for a negative resistance diode;

Figure 1:
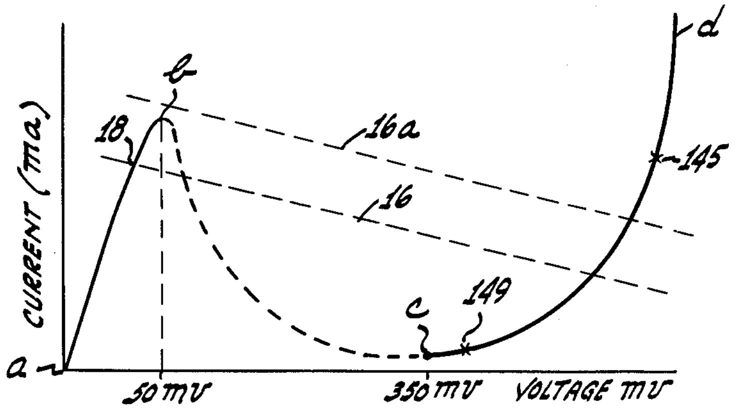

The brief review which follows of characteristics of negative resistance diodes and transistors, may help the reader better to understand the invention. FIG. 1 should be referred to first. Curve *abcd* is a characteristic curve of current versus voltage for a negative resistance diode of the voltage controlled type, known as a "tunnel diode." Such diodes and uses for them are described in an article by Sommers in the Proceedings of the IRE, July 1959, page 1201. The value of the current peak *b* is not shown in FIG. 1 since the actual value depends upon the way in which the diode is made (amount of doping, for example). For example, the diode peak may be of the order of a milliampere or so or it may be 50 milliamperes or more. The peak *b* may occur at a voltage of about 50 millivolts and the valley *c* at a voltage of about 350 millivolts.

Figure 2:
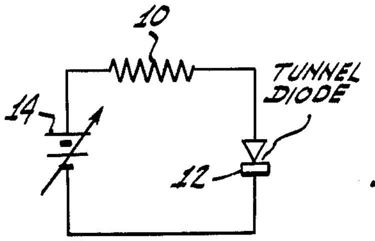
FIG. 2 is a simple circuit for explaining the curve of FIG. 1.

The portions *ab* and *cd* of the curve of FIG. 1 may be obtained with a circuit like the one shown in FIG. 2. It includes a resistor 10 in series with a negative resistance diode 12 and a source of voltage 14 connected across the series circuit. It may be assumed for the purpose of the present discussion that the value of resistance 10 is many, say 10 or more, times higher than that of diode 12 so that the source 14 and resistor 10 together act substantially like a constant current source. If the current through the diode 12 is varied as, for example, by varying the source voltage 14 first in the positive and then in the negative directions, the curve shown in solid lines of FIG. 1 is obtained. The portions *ab* and *cd* of the curve are regions of positive resistance. In other words, the inverse of the slope $dE/dI$, is a positive quantity. The region *bc* of the curve is not observable using the plotting techniques described and is therefore shown by dashed line. The region may be observed by using a constant voltage load line and reducing circuit inductance to reduce the tendency of the circuit to oscillate. This region *bc* is termed a "negative resistance region."

The load line 16 for resistor 10 of the circuit is almost parallel to the voltage axis and is sometimes termed a constant-current load line. Assume the circuit to be quiescently operating at the intersection 18 of the load line and the positive resistance region *ab*. If the current through the circuit is increased to a value beyond that represented by point *b*, the diode rapidly switches to the high voltage state and operates at the point represented by the intersection of the shifted load line 16*a* and the positive resistance region *cd*. Conversely, if after the diode is in the high voltage state *cd*, the current through the diode is reduced to a value lower than that represented by point *c*, the diode switches back to its low voltage state *ab*.

The two stable state characteristic described above is important in computer applications. The low voltage state of the diode may, for example, represent a binary digit of one type such as binary zero and the high voltage state of the diode a binary of the other type, such as binary one.

Figure 3:
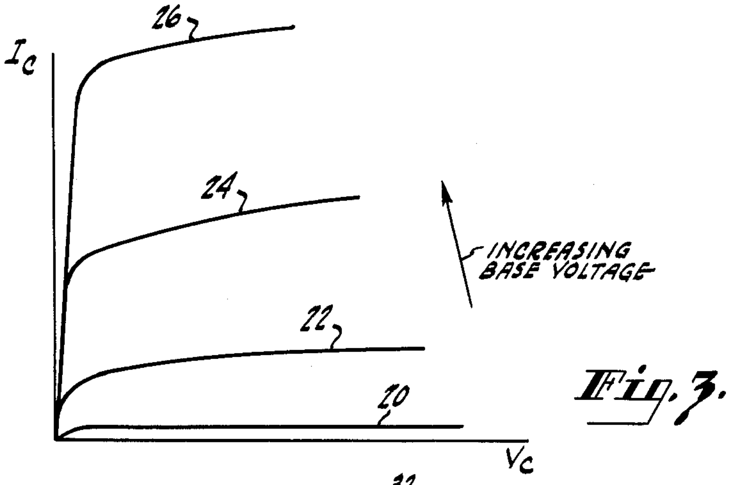
FIG. 3 is a characteristic curve of collector current versus collector voltage for a conventional transistor.

If a fixed forward voltage is applied to the base of a transistor and the collector voltage is increased from zero to some given value, a curve such as 20 in FIG. 3 may be obtained. If the base-to-emitter voltage is subsequently increased in discrete steps and the collector voltage varied for each step in the manner described, the family of curves 20, 22, 24, 26, etc., is obtained.

Figure 4:
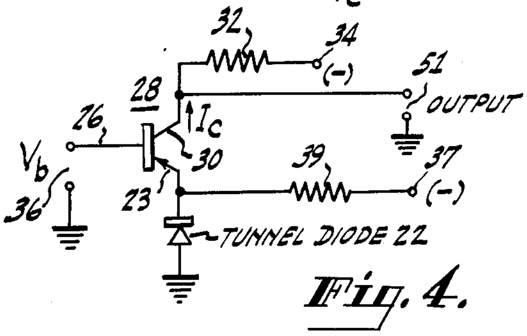
FIG. 4 is a schematic circuit diagram of a negative resistance diode-transistor circuit according to the present invention.

A circuit according to the present invention which includes a PNP transistor and a tunnel diode is shown in FIG. 4. Here and in other circuits to be discussed, NPN transistors suitably connected may, of course, be used instead. A tunnel diode 22 is connected in series with the emitter 23 to base 26 diode of transistor 28. (The cathode of the tunnel diode is connected to the anode (emitter) of the emitter-base diode; however, if a NPN transistor were used, the anode of the tunnel diode would be connected the emitter of the transistor.) The term "series" connected, as used here, implies that the input voltage $V_b$ divides between the base-emitter diode and the tunnel diode. The collector 30 is connected through a load resistor 32 to a terminal 34 to which a source of negative operating voltage is applied. The emitter is connected through a resistor 39 of relatively large value (perhaps several hundred ohms) to a terminal 37 to which a negative bias voltage may be applied.

Figure 5:
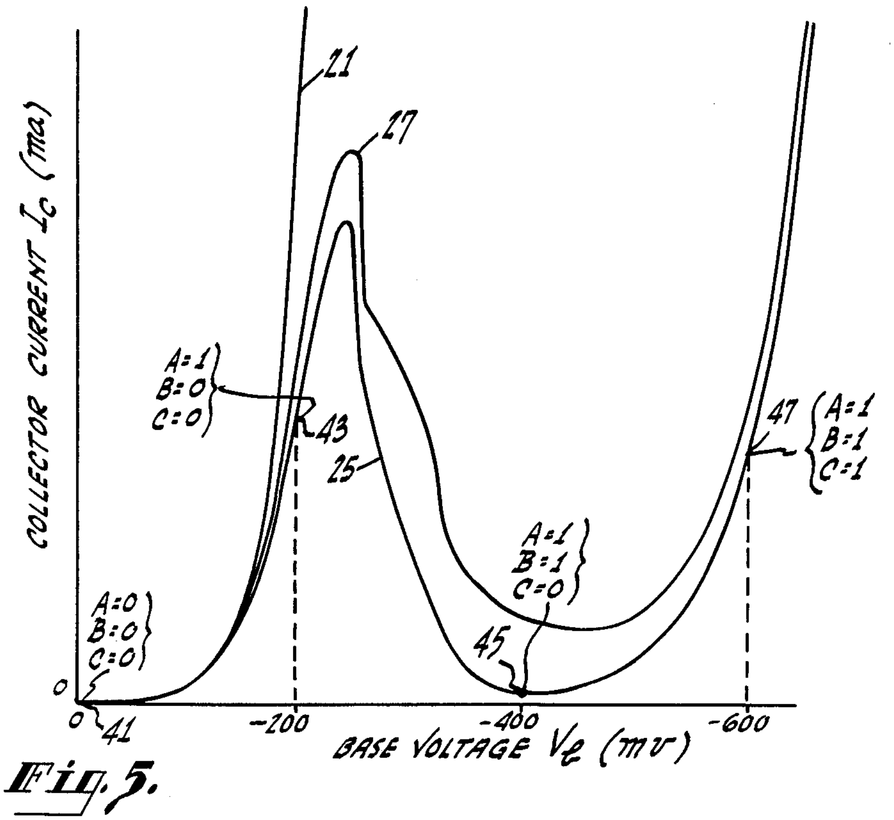
FIG. 5 shows characteristic curves of current versus voltage and is used to explain the circuit of FIG. 4.

Curve 21 of FIG. 5 is a plot of collector current $I_c$ versus base voltage $V_b$ for the transistor of FIG. 4 (no tunnel diode connected to the emitter). Curve 27 is a plot of $I_c$ versus $V_b$ for the circuit of FIG. 4 with the biasing source to terminal 37 omitted. Curve 25 is a plot of $I_c$ versus $V_b$ for the complete circuit of FIG. 4.

In operation, tunnel diode 22 is initially in its low state. With no base voltage $V_b$ applied to terminals 36, the circuit operating point is at $V_b=0$, $I_c=0$, as shown at 41 in FIG. 5. When the transistor current output is low or zero, a negative output voltage approximately equal to the voltage at terminal 34 appears at output terminals 51. This output voltage represents a binary zero. If a small voltage of the order of say —200 millivolts is applied to terminals 36, the operating point switches to 43, which represents a substantial transistor-collector current. When the transistor current is high, the output voltage at terminals 51 becomes less negative and approaches ground. This output voltage represents a binary one. Tunnel diode 22 is still in its low state but the current through it increases and the voltage across it slightly increases.

If the input voltage $V_b$ is increased further to —400 millivolts, the operating point switches to 45 in the high voltage operating state of the diode. When the diode switches, the voltage at the cathode 38 of the diode 22 jumps from about —40 or —50 millivolts to about —400 millivolts, thereby tending to reverse bias the emitter-to-base diode 24, 26 and decrease the transistor-collector current. Again, low transistor current (relatively high, negative transistor output voltage) represents a binary zero. Further increase in the input voltage to —600 volts switches the operating point to 47. This represents a substantial current $I_c$ (transistor output voltage close to ground), or a binary one.

Figures 6, 7:
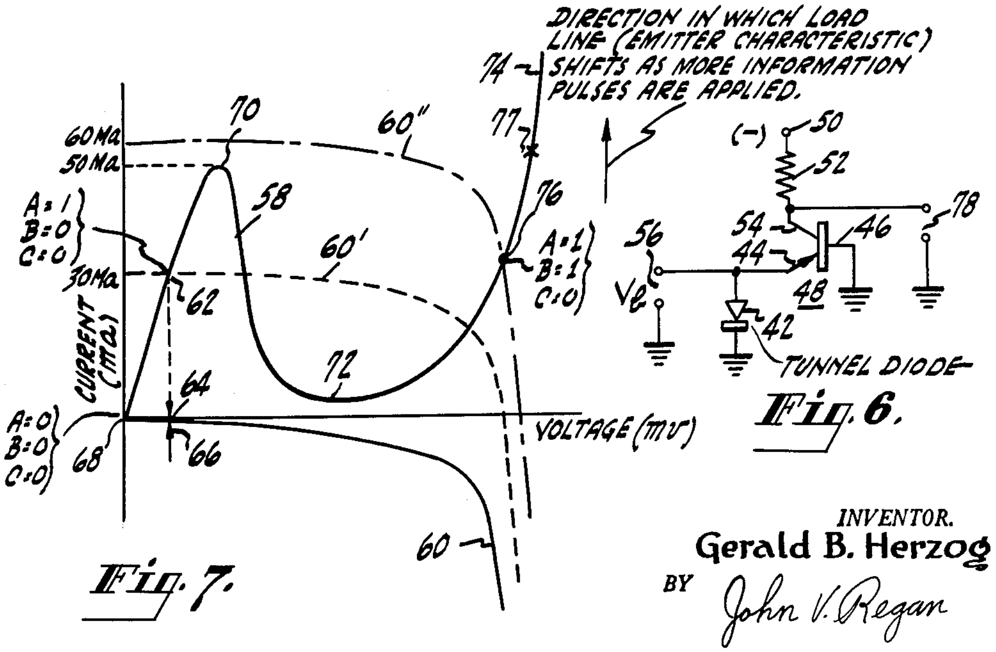
FIG. 6 is a negative resistance diode-transistor circuit made use of in the adder of FIG. 8.
FIG. 7 is a characteristic curve of current versus voltage for the circuit of FIG. 6.

The circuit of FIG. 6 includes a tunnel diode 42 connected in parallel with the emitter 44 to base 46 diode of a PNP transistor 48. The term "parallel," as used here, implies that the input voltage $V_b$ is the same across the tunnel diode and the emitter-base diode, and the input current divides between the tunnel diode and the emitter of the transistor. In the circuit shown, the anode of the tunnel diode is connected to the emitter. If a NPN transistor is used, the cathode of the diode is connected to the emitter. A negative voltage is applied from terminal 50 through resistor 52 to the collector 54 of transistor 48. The input signal, usually a pulse, is applied to input terminals 56.

Curves useful in describing the circuit operation are shown in FIG. 7. The current versus voltage characteristic for the tunnel diode 42 is shown at 58. For the purposes of the present explanation, the emitter circuit of the transistor is considered to be the load on the tunnel diode. With no pulses applied to terminals 56, the emitter circuit load line is as shown in solid line at 60. This is the normal transistor emitter current—emitter-to-base voltage characteristic inverted about the voltage axis. The two curves 58 and 60 intersect at operating point 0, 0.

Assume for the purposes of the present explanation that the current peak of curve 58 occurs at 50 milliamperes. Assume also that a current pulse is applied to terminal 56 of the order of 30 milliamperes. The applied current pulse is in the forward direction both with respect to tunnel diode 42 and the emitter-to-base diode 44, 46. Since the transistor is now being considered as a load, the effect of the current pulse may be represented as a shift in the emitter-base diode load line from solid curve 60 to dashed curve 60'. The intersection between the shifted load line 60' and the tunnel diode characteristic 58 is at point 62. It may be observed that at point 62 substantially the entire 30 milliampere pulse is shunted through the tunnel diode. The resistance of the emitter-to-base diode is relatively high, and the current passing into the emitter is quite low. It can be represented as the very small current increment appearing between arrows 64, 66 in FIG. 7.

Assume now that a current pulse of 60 milliamperes is applied to terminal 56 of the circuit of FIG. 6. The effect of a 60 milliampere pulse is to shift load line 60 to the position shown by dot-dashed load line 60''. This load line 60'' does not intersect the low voltage positive resistance region 68, 70 of the tunnel diode characteristic. It does, however, intersect the high voltage positive resistance region 72, 74 at operating point 76. In other words, when a current pulse of greater than 50 milliamperes is applied to terminal 56, tunnel diode 42 switches from its low voltage state to its high voltage state. It may be observed that in its high voltage state (operating point 76) the emitter circuit draws a substantial amount of current and accordingly the output voltage at terminals 78 switches from a relatively large negative value to a value close to ground.

Figure 8:
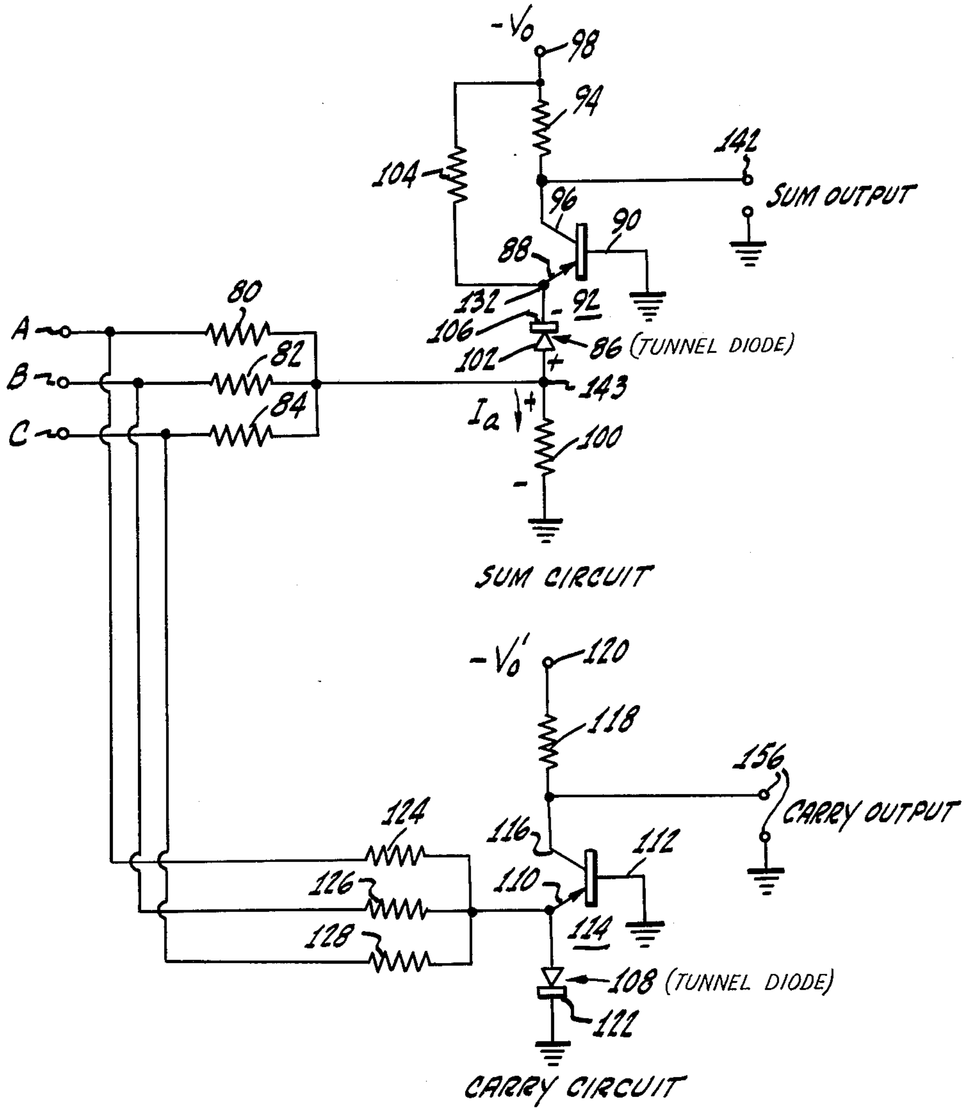
FIG. 8 is a schematic circuit diagram of an adder according to the present invention.

An adder circuit incorporating the circuits of FIGS. 4 and 6 is shown in FIG. 8. The signals indicative of the binary digits to be added are applied concurrently to input terminals A, B, and C. A positive input pulse represents the binary digit one and the absence of an input pulse the binary digit zero. The signals are applied through coupling resistors 80, 82 and 84 to the sum circuit. The latter includes a tunnel diode 86 connected in series with the emitter 88-to-base 90 diode of a PNP transistor 92. The connection between the diodes is direct, that is, ohmic. Also in the series circuit are a load resistor 94 of relatively large value connected between the collector 96 of the transistor and a terminal 98 to which a source of negative operating voltage $V_0$ may be applied, and a resistor 100 of relatively small value connected between the anode 102 of the tunnel diode and ground. (The precise values of resistors here and in other circuits discussed depend upon the characteristics of the tunnel diode and transistor employed. Typically, resistor 94 may be from several hundred to several thousand ohms and resistor 100, 50 ohms or less, however, other values are possible.) The base 90 of the transistor is also connected to ground. A bias voltage is applied from voltage terminal 98 through resistor 104 to the terminal 132 which is common to the emitter of the transistor and the cathode 106 of the tunnel diode.

The carry circuit includes a tunnel diode 108 connected in parallel with the emitter 110 to base 112 diode of PNP transistor 114. The collector 116 of the transistor is connected through a load resistor 118 of relatively large value to a terminal 120 to which a source of negative operating voltage $-V_0'$ may be connected. The base 112 of the transistor is grounded as is the cathode 122 of the tunnel diode. Input signals are applied from input terminals A, B, and C through coupling resistors 124, 126 and 128, respectively, to the emitter 110.

The truth table for an adder circuit having A, B, and C inputs is as follows.

| A | B | C | Sum | Carry |
|---|---|---|---|---|
| 0 | 0 | 0 | 0 | 0 |
| 1 | 0 | 0 | 1 | 0 |
| 1 | 1 | 0 | 0 | 1 |
| 1 | 1 | 1 | 1 | 1 |

The circuit of FIG. 8 implements the truth table above as follows. Assume first that each input represents the binary digit zero, that is, $A=0$, $B=0$, $C=0$. The voltage applied from terminal 98 through resistor 104 to terminal 132 reverse biases the emitter-to-base diode of the transistor and forward biases the tunnel diode. As the base-to-emitter diode is reverse biased, substantially no current flows in the emitter-to-collector circuit of the transistor and a negative output voltage or signal representing a binary zero appears at terminals 142. This negative output voltage is close in value to $-V_0$, the negative voltage at terminal 98.

Assume now that one of the three inputs represents the binary digit one and the other two the binary digit zero. For example, assume that a positive pulse appears at input terminal A and no pulses at input terminals B and C. The positive pulse produces a current flow $I_a$ through resistor 100 which is in a direction opposite to that produced by the biasing voltage $-V_0$. In the absence of the input pulse, terminal 143 between the tunnel diode anode and resistor 100 is slightly negative. The current $I_a$ due to the input pulse causes the net voltage at terminal 143 to become positive. The increased voltage at terminal 142 slightly increases the voltage across the tunnel diode (it still remains in its low state) and substantially increases the forward current flow through the tunnel diode. The circuit parameters are such that the net voltage at terminal 132 (which is equal to the voltage across resistor 100 less the voltage across tunnel diode 86) is positive. Accordingly, substantially all of the forward current flowing through the tunnel diode flows into the emitter and an output voltage having a value much less negative than the voltage $-V_0$ at terminal 98 appears at output terminals 142. This voltage, which is equal to $-(V_0-I_cR_{94})$, represents a binary one.

The circuit operation under the conditions above is illustrated in FIG. 5 by a shift in operation from operating point 41 to operating point 43. It is illustrated in FIG. 1 by a shift of the operation from a point near *a* to one at or close to 18.

Assume now that two input pulses are applied to the input terminals as, for example, to terminals A and B. These increase the current $I_a$ passing through resistor 100 and make the voltage at point 143 more positive. The voltage is made sufficiently positive so that the resulting current in the forward direction through tunnel diode 86 switches diode 86 from its low to its high voltage state. The voltage across the diode is in a direction opposite to that across resistor 100, as indicated by the plus and minus signs across these two elements. The circuit parameters are such that even though the voltage at terminal 143 is made more positive, the voltage at terminal 132 is made either negative or only slightly positive with respect to the base. This may be considered to be a result of the tunnel diode impedance which becomes high for increased voltages as at point 149 in FIG. 1. The result is that little or no current flows in the emitter-to-collector circuit of transistor 92 and a relatively high, negative voltage indicative of the binary digit zero appears at output terminals 142.

The difference in circuit operation when one input pulse is applied to the sum circuit and when two concurrent input pulses are applied may be represented in FIG. 5 by a shift in circuit operation from point 43 to point 45 on curve 25. It may be represented in FIG. 1 by a change in the current through the tunnel diode from a high current value in the low voltage state as is represented by 18 to a low current value in the high voltage state as represented by 149.

Assume now that three concurrent pulses are applied to terminals A, B, and C. The voltage at terminal 143 is made more positive, however, the tunnel diode 86 is switched to the portion of its high voltage state in which it is a low impedance, and the voltage across it does not increase substantially over that which it assumes in response to two concurrent pulses. Terminal 132 therefore becomes positive and substantial current flows in the emitter 88-to-collector 96 path. Accordingly, a relatively low negative voltage representative of the binary digit one appears at output terminals 142.

The operation of the carry circuit is the same as that represented in FIG. 7. With no input pulses applied, tunnel diode 108 is in its low voltage state and there is a relatively high negative voltage at terminals 156 (FIG. 8) representative of a binary zero. When a single input pulse is applied to the diode, the diode remains in its low voltage state. The current conducted in the emitter 110 to base 112 diode is insiginificant since the emitter-to-base impedance is much higher than that of the tunnel diode. When two input pulses are applied, tunnel diode 108 switches to its high voltage state and substantial current flows in the emitter-to-collector path of the transistor. Thus, a relatively low, negative voltage, representing a binary zero appears at output terminal 156. Likewise, when three input pulses are applied, tunnel diode 108 is also in its high state and a binary one output signal appears at output terminals 156. The operating points of the circuit for zero, one, and two input pulses are shown at 68, 62 and 76, respectively, in FIG. 7. The operating point for three input pulses is at 77 in FIG. 7.

What is claimed is:

1. In combination, a transistor having emitter, collector, and base electrodes; a connection from said base electrode to ground; an impedance element; a voltage controlled negative resistance device connected at one electrode to said emitter electrode and connected at its other electrode through said impedance element to ground; means for applying an operating voltage to said collector electrode; means for applying an input signal to the connection between said negative resistance device and said impedance element; and means for deriving an output signal from said collector electrode.

2. In combination, a transistor having emitter, collector, and base electrodes; a connection from said base electrode to ground; a resistor; a tunnel diode connected at one electrode to said emitter electrode and at its other electrode through said resistor to ground and poled in the same direction as the emitter-to-base diode of said transistor; means for applying an operating voltage to said collector electrode; an output terminal at said collector electrode; and means connected to the connection between said tunnel diode and said resistor for switching the operating point of said tunnel diode between at least two values, one in the higher current region of its low voltage state and the other in the lower current region of its high voltage state.

3. In combination, a transistor having emitter, collector, and base electrodes; a connection from said base electrode to ground; a resistor; a tunnel diode connected at one electrode to said emitter electrode and at its other electrode through said resistor to ground and poled in the same direction as the emitter-to-base diode of said transistor; means for applying an operating voltage to said collector electrode; an output terminal at said collector electrode; and means connected to the connection between said tunnel diode and said resistor for switching the operating point of said tunnel diode among at least three values, one in the lower current region of its low voltage state, another in the higher current region of its low voltage state, and the third in the lower current region of its high voltage state.

References Cited by the Examiner

UNITED STATES PATENTS

| | | | |
|---|---|---|---|
| 2,765,115 | 10/56 | Beloungie | 307—88.5 |
| 2,898,479 | 8/59 | McElroy | 307—88.5 |
| 2,930,530 | 3/60 | Saxby et al. | 235—176 |
| 2,951,124 | 8/60 | Hussey et al. | 307—88.5 |
| 2,971,696 | 2/61 | Henle | 235—176 |
| 3,015,734 | 1/62 | Jones | 307—88.5 |
| 3,054,911 | 9/62 | Buelow | 307—88.5 |
| 3,116,459 | 12/63 | Tiemann | 307—88.5 |

OTHER REFERENCES

Pub. 2: Electronics, Nov. 6, 1959, pages 54–57.

Lesk et al.: "The Tunnel Diode . . .," Electronics (magazine), Nov. 27, 1959, pages 6 to 64, (page 64 relied on).

Pressman: Design of Transistorized Circuits for Digital Computers (Text), March 1959 (pages 3–45 and 10–268 relied on).

Pub. I: RCA Technical Notes No. 260, June 1959, "Pulse Count Circuit."

ARTHUR GAUSS, *Primary Examiner.*

GEORGE N. WESTBY, WALTER W. BURNS, JR., *Examiners.*